US012652796B2

(12) United States Patent
Tsai

(10) Patent No.: US 12,652,796 B2
(45) Date of Patent: Jun. 9, 2026

(54) MEMORY DEVICE HAVING A BARRIER LAYER BETWEEN A BIT LINE CONTACT AND A TOP ELECTRODE

(71) Applicant: NANYA TECHNOLOGY CORPORATION, New Taipei city (TW)

(72) Inventor: Jhen-Yu Tsai, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 375 days.

(21) Appl. No.: 18/244,242

(22) Filed: Sep. 9, 2023

(65) Prior Publication Data

US 2025/0089240 A1 Mar. 13, 2025

(51) Int. Cl.
*H10B 12/00* (2023.01)
(52) U.S. Cl.
CPC ......... *H10B 12/485* (2023.02); *H10B 12/036* (2023.02); *H10B 12/05* (2023.02); *H10B 12/33* (2023.02); *H10B 12/482* (2023.02)

(58) Field of Classification Search
CPC ...... H10B 12/036; H10B 12/05; H10B 12/33; H10B 12/482; H10B 12/485
See application file for complete search history.

(56) References Cited

U.S. PATENT DOCUMENTS 12,520,475 B2 * 1/2026 Sukekawa .............. H10B 12/03
12,527,000 B2 * 1/2026 Ramaswamy ......... H10B 53/30

FOREIGN PATENT DOCUMENTS

TW 202133390 A 9/2021

* cited by examiner

*Primary Examiner* — Hoai V Pham
(74) *Attorney, Agent, or Firm* — CKC & Partners Co., LLC

(57) ABSTRACT

A manufacturing method of a memory device includes forming a capacitor in a first dielectric layer, and forming a bottom electrode over the capacitor. A word line and a second dielectric layer are formed over the bottom electrode and the first dielectric layer, in which the word line is embedded in the second dielectric layer. A bit line contact is formed over the second dielectric layer, in which a vertical projection of the bit line contact on the first dielectric layer is spaced apart a vertical projection of the bottom electrode on the first dielectric layer. After forming the bit line contact, a channel in contact with the bottom electrode and the word line is formed. A top electrode is formed over the channel and in contact with the bit line contact.

10 Claims, 22 Drawing Sheets

170    110              140    195

Y
X

140'

132

122

110

104

102

100

MEMORY DEVICE HAVING A BARRIER LAYER BETWEEN A BIT LINE CONTACT AND A TOP ELECTRODE

BACKGROUND

Field of Disclosure

The present disclosure relates to a memory device and a manufacturing method thereof.

Description of Related Art

A typical dynamic random-access memory (DRAM) cell incorporates a capacitor and a transistor in which the capacitor temporarily store data based on the charged state of the capacitor. A bit line is electrically connected to a source region of the transistor, and a word line is electrically connected to a gate region of the transistor. The channel region of the transistor may be made of oxide semiconductor, such as indium gallium zinc oxide (IGZO), indium zinc oxide (IZO), indium tin oxide (ITO). The channel made of oxide semiconductor is easily affected by certain substances, such as hydrogen, formed from the manufacturing process of the memory device. Therefore, the concentration of hydrogen in the channel should be reduced to prevent hydrogen from affecting the characteristics of the channel.

SUMMARY

Some embodiments of the present disclosure provide a manufacturing method of a memory device, including forming a capacitor in a first dielectric layer, and forming a bottom electrode over the capacitor. A word line and a second dielectric layer are formed over the bottom electrode and the first dielectric layer, in which the word line is embedded in the second dielectric layer. A bit line contact is formed over the second dielectric layer, in which a vertical projection of the bit line contact on the first dielectric layer is spaced apart a vertical projection of the bottom electrode on the first dielectric layer. After forming the bit line contact, a channel in contact with the bottom electrode and the word line is formed. A top electrode is formed over the channel and in contact with the bit line contact.

In some embodiments, forming the bit line contact includes forming a sacrificial layer over the second dielectric layer, forming a third dielectric layer over the sacrificial layer, forming a first trench to expose the second dielectric layer by patterning the third dielectric layer and the sacrificial layer, forming a barrier material layer in the first trench, and filling a bit line contact material in the first trench and covering the barrier material layer.

In some embodiments, a vertical projection of the first trench on the first dielectric layer is spaced apart the vertical projection of the bottom electrode on the first dielectric layer.

In some embodiments, forming the channel includes forming a second trench penetrating through the third dielectric layer, the sacrificial layer, the second dielectric layer, the word line and exposing the bottom electrode, and filling the second trench with a channel material, and the method further includes forming a gate dielectric layer lining a sidewall of the word line before forming the channel.

In some embodiments, the manufacturing method further includes etching the channel material until a top surface of the channel material is below the sacrificial layer.

In some embodiments, forming the top electrode includes forming a third trench by etching a portion of the sacrificial layer, in which the third trench exposes a sidewall of the barrier material layer, filling a top electrode material in the third trench, forming a fourth trench by back-etching the top electrode material, and filling a dielectric material in the fourth trench over the top electrode.

In some embodiments, the channel is free of hydrogen.

In some embodiments, a temperature of forming the capacitor is higher than a temperature of forming the channel.

In some embodiments, the channel is made of oxide semiconductor material.

In some embodiments, the manufacturing method further includes forming a bit line in contact with the bit line contact.

Some embodiments of the present disclosure provide a memory device, including a first dielectric layer, a capacitor, a bottom electrode, a channel, a top electrode, a gate dielectric layer, a word line, a second dielectric layer, a bit line contact and a barrier layer. The capacitor is in the first dielectric layer. The bottom electrode is over the capacitor. The channel is over the bottom electrode. The top electrode over the channel. The gate dielectric layer surrounds the channel. The word line surrounds the gate dielectric layer. The second dielectric layer surrounds the word line, the gate dielectric layer and the channel. The bit line contact is over the second dielectric layer, in which a vertical projection of the bit line contact on the first dielectric layer is spaced apart a vertical projection of the channel on the first dielectric layer. The barrier layer is between the bit line contact and the top electrode.

In some embodiments, a vertical projection of the top electrode on the first dielectric layer completely covers the vertical projection of the channel on the first dielectric layer.

In some embodiments, the top electrode comprises a first portion and a second portion over the first portion, a sidewall of the second portion of the top electrode protrudes from a sidewall of the first portion of the top electrode, and the sidewall of the second portion of the top electrode is in contact with the sidewall of the barrier layer.

In some embodiments, the sidewall of the first portion of the top electrode is aligned with a sidewall of the gate dielectric layer.

In some embodiments, a bottom of the second portion of the top electrode is aligned with a bottom of the barrier layer.

In some embodiments, a bottom of the second portion of the top electrode is in contact with the second dielectric layer.

In some embodiments, the memory device further includes a third dielectric layer over the top electrode, and a fourth dielectric layer in contact with a sidewall of the top electrode, in which the third dielectric layer is in contact with a top surface of the top electrode and a top surface of the fourth dielectric layer, and the fourth dielectric layer is made of different material from the third dielectric layer.

In some embodiments, the third dielectric layer over the top electrode is further in contact with a sidewall of the barrier layer.

In some embodiments, the channel is made of oxide semiconductor material.

In some embodiments, the memory device further includes a bit line in contact with the bit line contact.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Some embodiments of the present disclosure are related to oxide semiconductor devices in a memory array. The oxide semiconductor devices are made of oxide semiconductor sensitive to hydrogen diffusion caused by the manufacturing process of other components, such as bit line contacts. Therefore, the forming sequence and the location of the bit line contacts relative to the oxide semiconductor devices are adjusted to reduce the effect of the hydrogen diffusion to the oxide semiconductor devices. The memory array may be vertical dynamic random-access memory (DRAM) in some embodiments.

Figure 1:
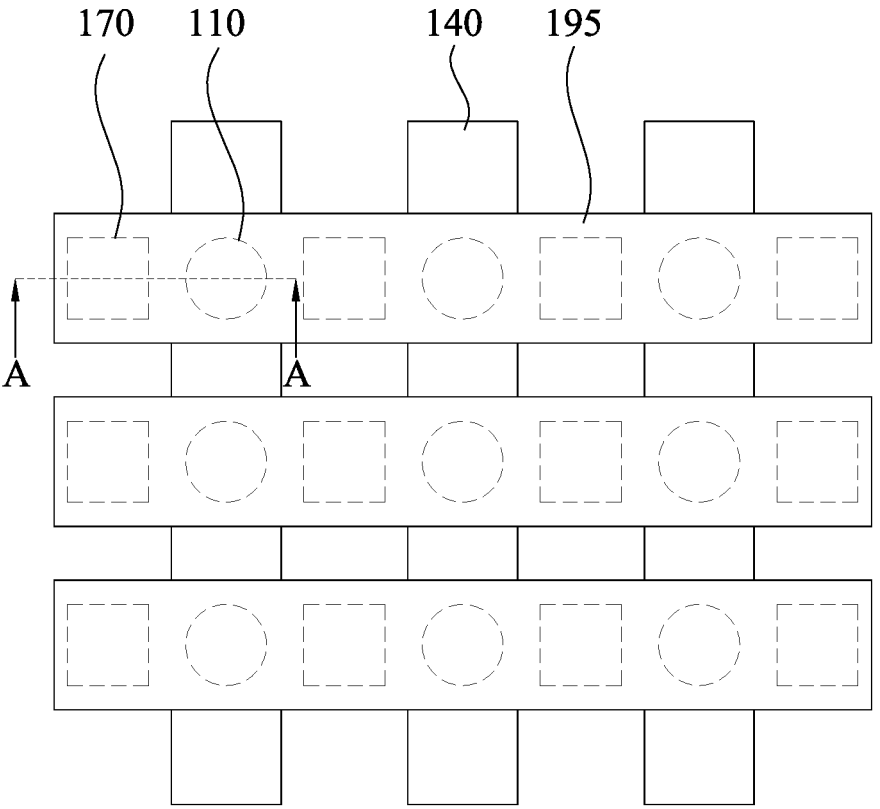
FIG. 1 illustrates a top view of a memory array in some embodiments of the present disclosure.
Figure 1:
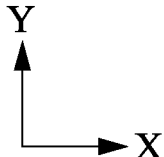
Figure 2:
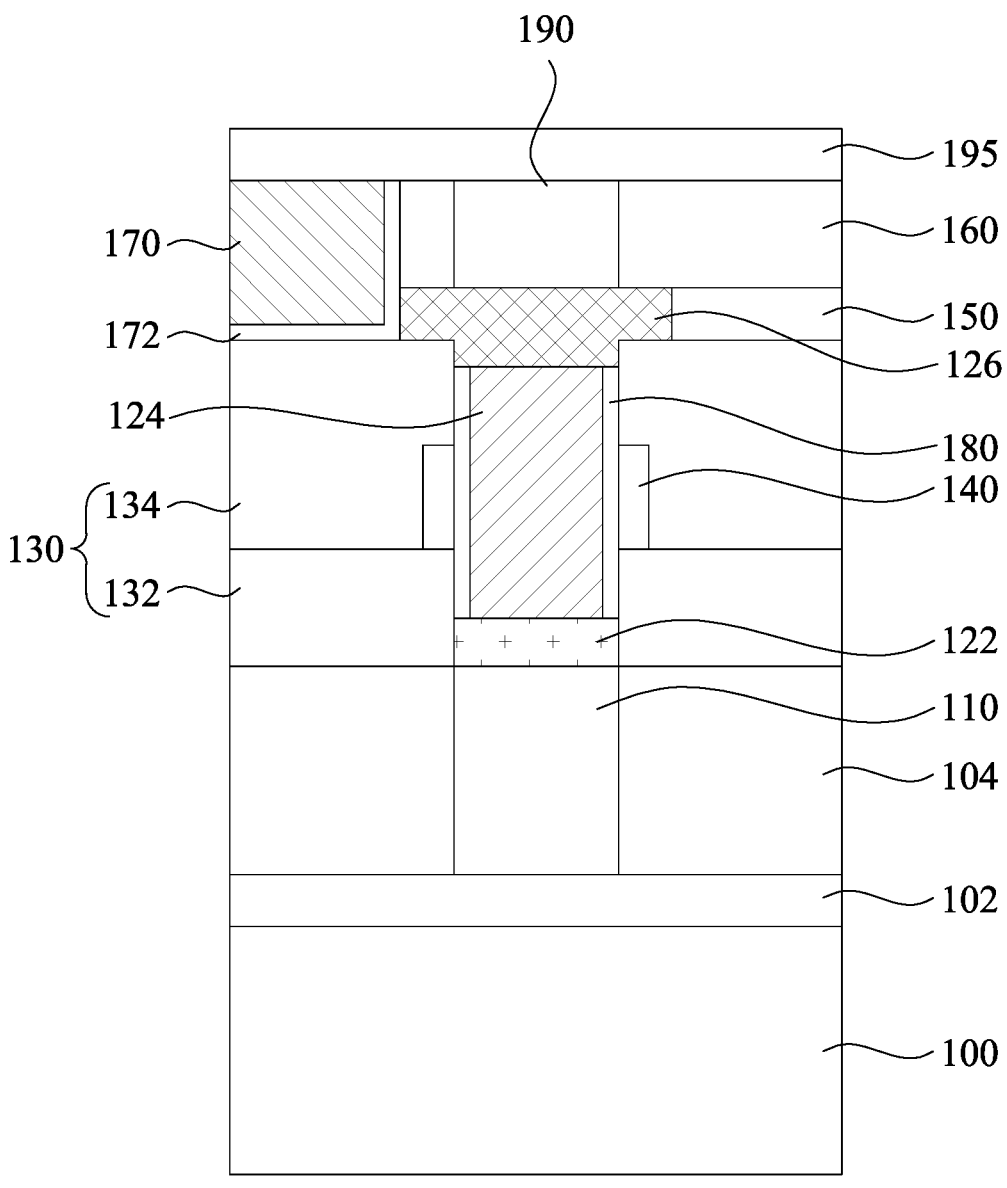
FIG. 2 illustrates a cross-section view taken along line A-A in FIG. 1.

FIG. 1 illustrates a top view of a memory array in some embodiments of the present disclosure. FIG. 2 illustrates a cross-section view taken along line A-A in FIG. 1. Referring to FIG. 1, the memory array in FIG. 1 may include a plurality of memory cells. A typical DRAM cell incorporates capacitor 110 and a transistor (discussed in FIG. 2) in which the capacitor 110 temporarily store data based on the charged state of the capacitor 110. A bit line 195 is electrically connected to a drain region of the transistor, and a word line 140 is electrically connected to a gate region of the transistor. The bit line 195 has a lengthwise direction along a first direction X, and the word line 140 has a lengthwise direction along a second direction Y perpendicular to the first direction X. On the assumption that a pitch of each of word line 140 and bit line 195 is 2F, a horizontal size of DRAM cell can be 4F2, which means that the DRAM cell can have an area of approximately 4F2 or less, where F is the minimum lithographic feature size.

A cross-sectional view of the memory device along line A-A of FIG. 1 is shown in FIG. 2, it is noted that some elements of FIG. 2 are not illustrated in FIG. 1 for simplicity. In FIG. 2, shown there is a semiconductor substrate 100. A metal layer 102 is disposed over the semiconductor substrate 100. As mentioned above, each memory cell of the memory device includes a capacitor 110 and a transistor. The capacitor 110 is in a dielectric layer 104 over the metal layer 102. The transistor of each memory cell may include the bottom electrode 122 (i.e. source region of the transistor), the channel 124, the top electrode 126 (i.e. drain region of the transistor), and the gate dielectric layer 180. The word line 140 may serve as the gate of the transistor.

Specifically, the bottom electrode 122 is over the capacitor 110. The channel 124 is over the bottom electrode 122. The top electrode 126 is over the channel 124. That is, the capacitor 110, the bottom electrode 122, the channel 124 and the top electrode 126 are stacked vertically. The gate dielectric layer 180 surrounds the channel 124. The word line 140 surrounds the gate dielectric layer 180. It is noted that although FIGS. 1-2 illustrate that the word line 140 is a surrounding gate structure, which means that the word line 140 surrounds the gate dielectric layer 180 and the channel 124 at all sides, the word line 140 in the memory device may also be a single gate structure, a double gate structure or a tri-gate structure.

The memory device further includes a bit line contact 170, a barrier layer 172 and a bit line 195. The bit line contact 170 is above the channel 124. The barrier layer 172 is between the bit line contact 170 and the top electrode 126. The bit line 195 is in contact with the bit line contact 170, and is electrically connected with the top electrode 126. A vertical projection of the bit line contact 170 (including the barrier layer 172) on the dielectric layer 104 is spaced apart a vertical projection of the channel 124 on the dielectric layer 104. That is, the bit line contact 170 (including the barrier layer 172) is laterally offset from the channel 124. Stated another way, the bit line contact 170 (including the barrier layer 172) does not overlap the channel 124 along the vertical direction in the cross-sectional view of FIG. 2. The relative location between the bit line contact 170 and the channel 124 is to prevent hydrogen diffusing from the barrier layer 172 during the formation of the bit line contact 170 and the barrier layer 172. The description related to hydrogen diffusing will be discussed later.

The memory device further includes a dielectric layer 132, a dielectric layer 134, a dielectric layer 150, a dielectric layer 160, and a dielectric layer 190. The dielectric layers 132 and 134 may be collectively referred to a dielectric layer 130. The dielectric layer 130 surrounds the bottom electrode 122, the channel 124, the gate dielectric layer 180 and the word line 140. The dielectric layer 160 and the dielectric layer 190 cover the top electrode 126 and are between the top electrode 126 and the bit line 195. The dielectric layer 150 is between the dielectric layer 160 and the dielectric layer 130, and is in contact with the sidewall of the top electrode 126.

Figure 3:
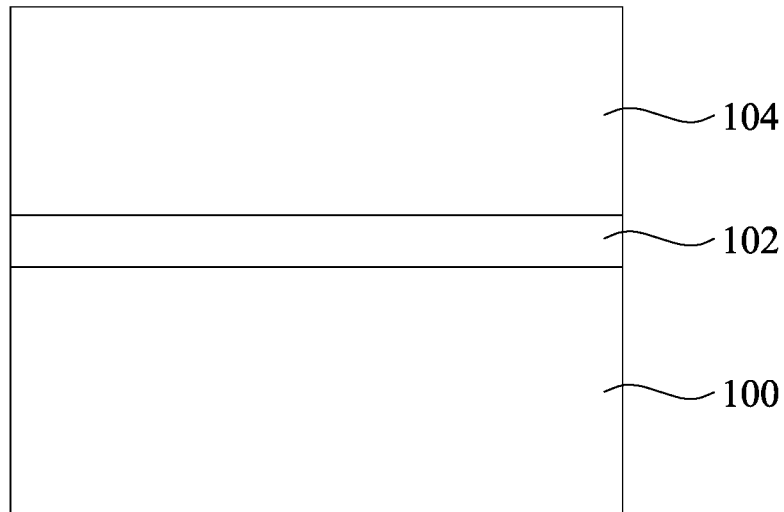
FIGS. 3-22 illustrate cross-section views of manufacturing method of the memory device in some embodiments of the present disclosure.

FIGS. 3-22 illustrate cross-section views of manufacturing method of the memory device in some embodiments of the present disclosure. Referring to FIG. 3, a metal layer 102 and a dielectric layer 104 are sequentially formed over a semiconductor substrate 100. In some embodiments, the semiconductor substrate 100 may be made of polysilicon but the disclosure is not limited thereto, the metal layer 102 may be made of tungsten (W), Titanium nitride (TiN), tantalum nitride (TaN), and the dielectric layer 104 may be made of silicon oxide, silicon nitride, but the disclosure is not limited thereto.

Figure 4:
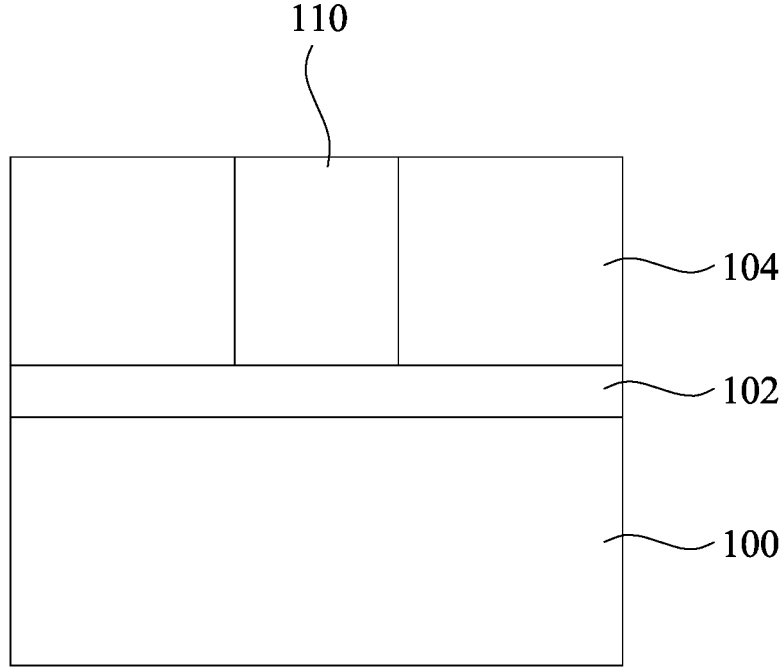

Referring to FIG. 4, a capacitor 110 is formed in the dielectric layer 104. It is noted that FIG. 4 illustrates the capacitor 110 as a pillar for simplicity. In some embodiments, the capacitor 110 includes an insulating layer cladded by two electrodes. In some embodiments, the temperature of forming the capacitor 110 is at least higher than 400 degree Celsius, such as 450 degree Celsius to 600 degree Celsius.

Figure 5:
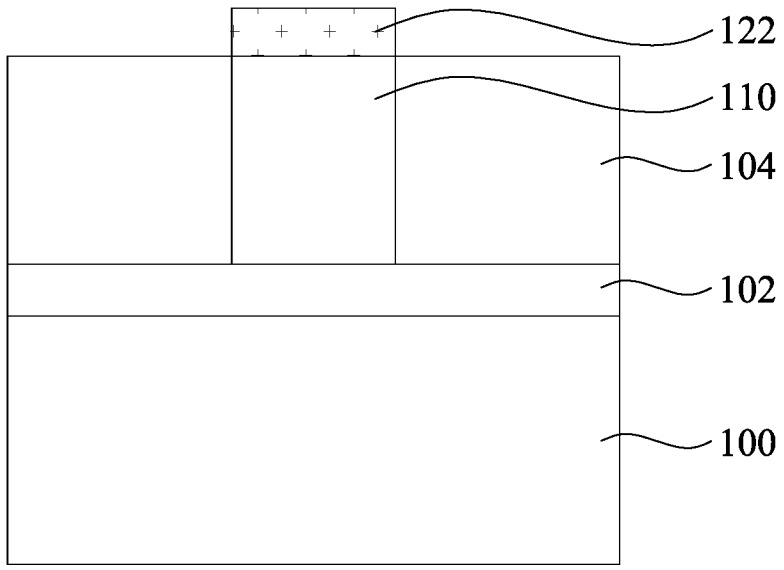

Referring to FIG. 5, a bottom electrode 122 is formed over the capacitor 110. Specifically, a bottom electrode material layer may be firstly formed over the dielectric layer 104 and covers the capacitor 110. Subsequently, the bottom electrode 122 is formed by patterning the bottom electrode material layer. The bottom electrode 122 may entirely covers the capacitor 110. In some embodiments, the bottom electrode 122 may be made of indium gallium zinc oxide (IGZO), indium zinc oxide (IZO), indium tin oxide (ITO). In some embodiments, the thickness of the bottom electrode 122 may be in a range of 10 nm to 50 nm.

Figure 6:
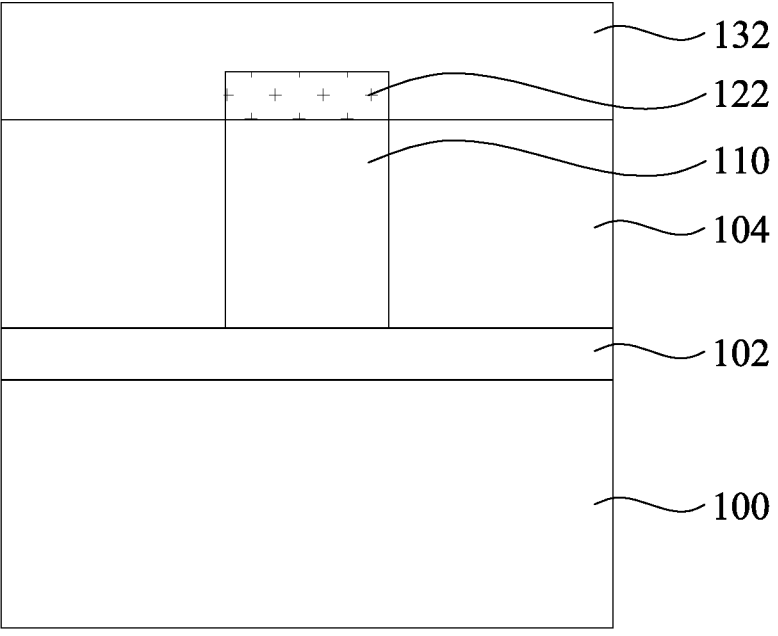

Referring to FIG. 6, a dielectric layer 132 is formed over the dielectric layer 104 and covering the bottom electrode 122. In some embodiments, the dielectric layer 132 may be made of silicon oxide, silicon nitride, but is not limited thereto. In some embodiments, the thickness of the dielectric layer 132 may be in a range of 20-100 nm.

Figure 7:
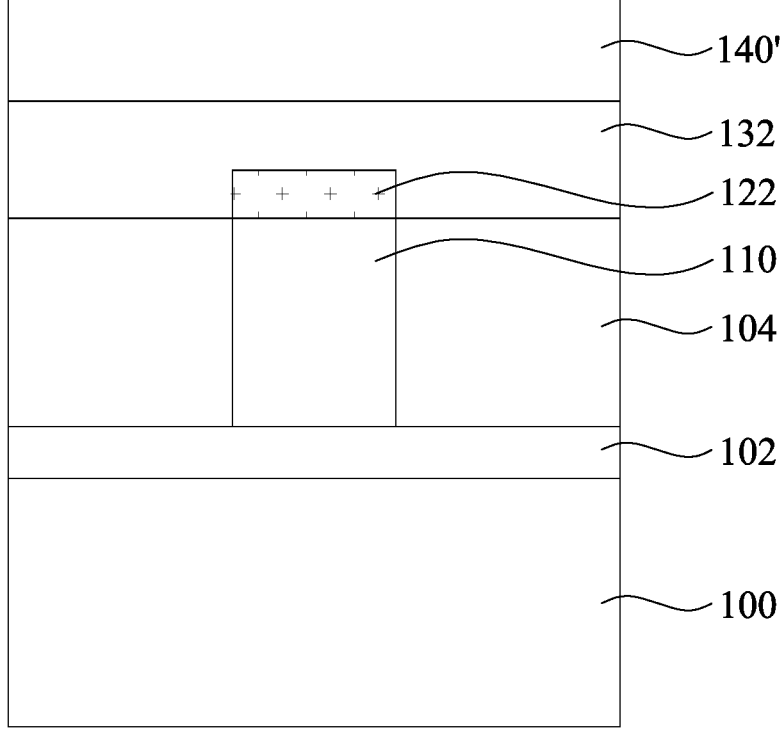
Figure 8:
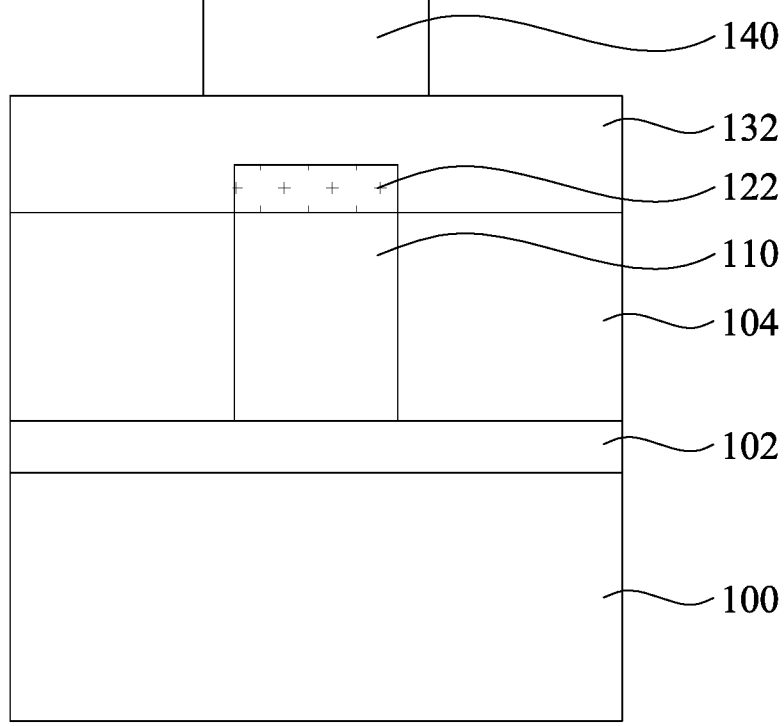

Referring to FIG. 7, a word line material layer 140' is formed over the dielectric layer 132, and referring to FIG. 8, the word line material layer 140' is patterned to form a word line 140 having a lengthwise direction along a first direction (such as the second direction Y in FIG. 1) and overlapping the bottom electrode 122. In some embodiments, the word line material layer 140' may be made of metal, such as tungsten (W), copper (Cu), or molybdenum (Mo), but is not limited thereto. In some embodiments, the thickness of the word line material layer 140' may be in a range of 10 nm to 500 nm.

Figure 9:
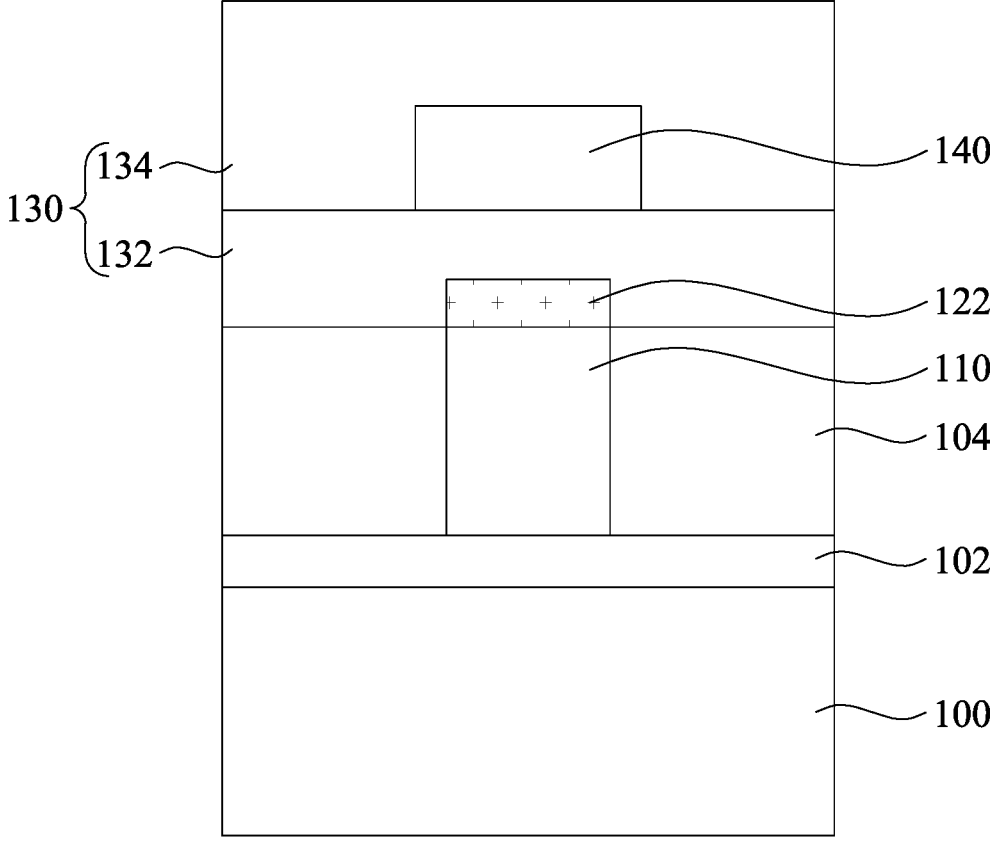

Referring to FIG. 9, a dielectric layer 134 is formed over the dielectric layer 132 and covering the word line 140. In some embodiments, the dielectric layer 134 may be made of silicon oxide, or silicon nitride, but is not limited thereto. In some embodiments, the thickness of the dielectric layer 134 may be in a range of 20 nm to 550 nm. Therefore, in FIGS. 7-9, the word line 140 and the dielectric layer 130 are formed over the bottom electrode 122 and the dielectric layer 104, and the word line 140 is embedded in the dielectric layer 130.

Figure 10:
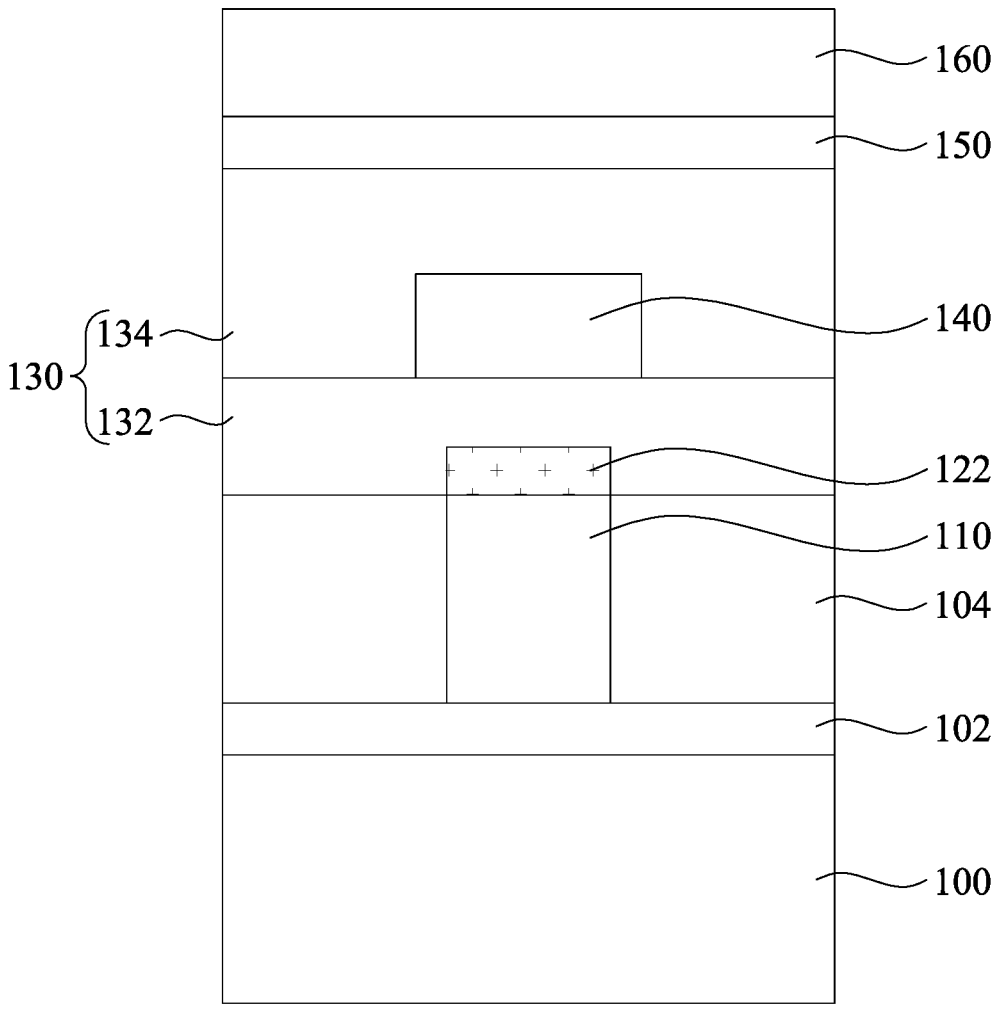

Referring to FIG. 10, a sacrificial layer 150 is formed over the dielectric layer 130, and a dielectric layer 160 is formed over the sacrificial layer 150. In some embodiments, the sacrificial layer 150 is made of a dielectric material, and thus the sacrificial layer 150 can also be referred to as dielectric layer 150. The material of the sacrificial layer 150 is different from the dielectric layer 160 and the dielectric layer 130. In some embodiments, the dielectric layer 160 may be made of silicon oxide or silicon nitride, but is not limited thereto, and the sacrificial layer 150 may be made of silicon oxide or silicon nitride, but is not limited thereto.

Figure 11:
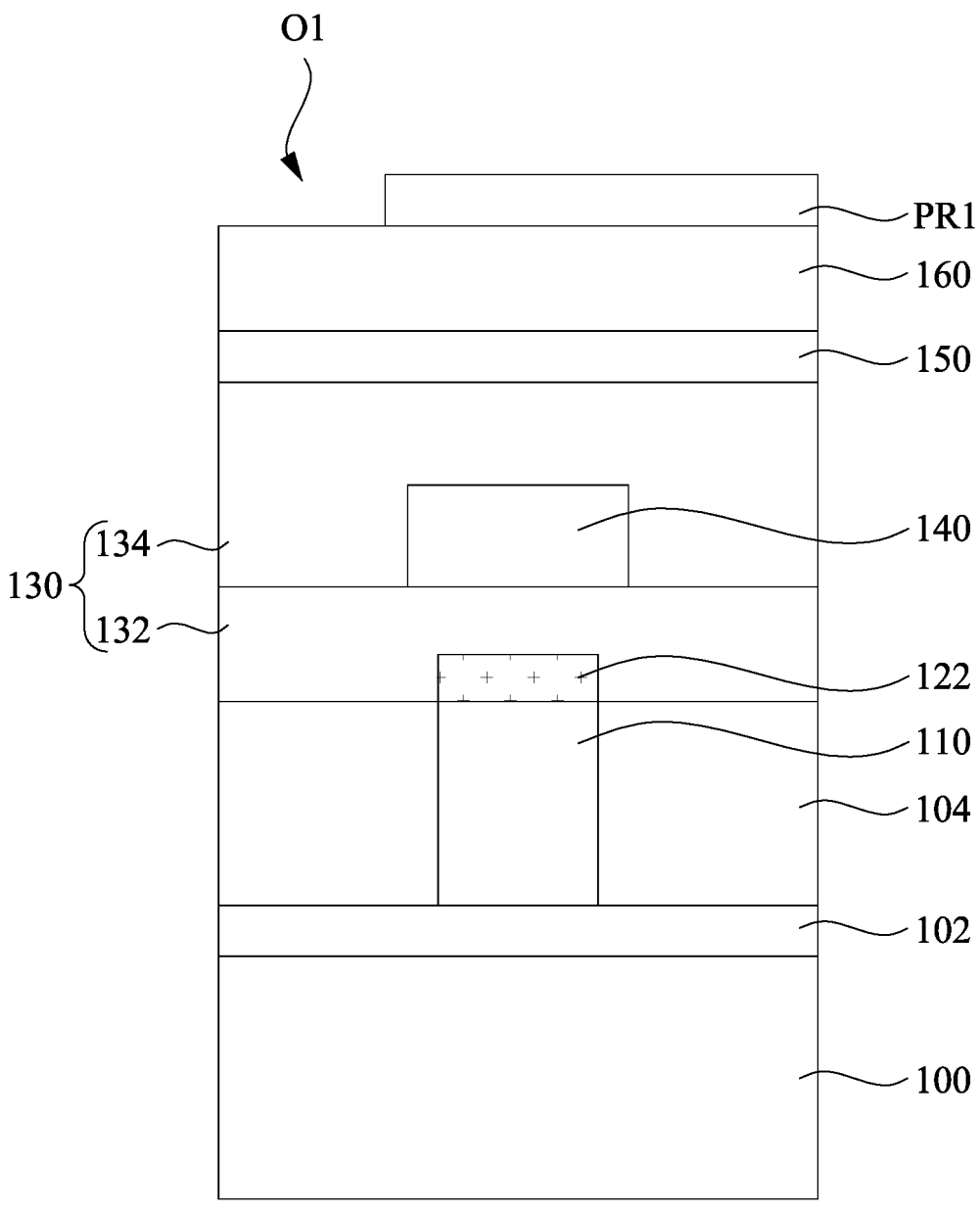

Referring to FIG. 11, a photoresist layer PR1 is formed over the dielectric layer 160. The photoresist layer PR1 includes an opening O1 exposing the dielectric layer 160, and a vertical projection of the opening O1 of the photoresist layer PR1 on the dielectric layer 104 does not overlap a vertical projection of the bottom electrode 122 on the dielectric layer 104.

Figure 12:
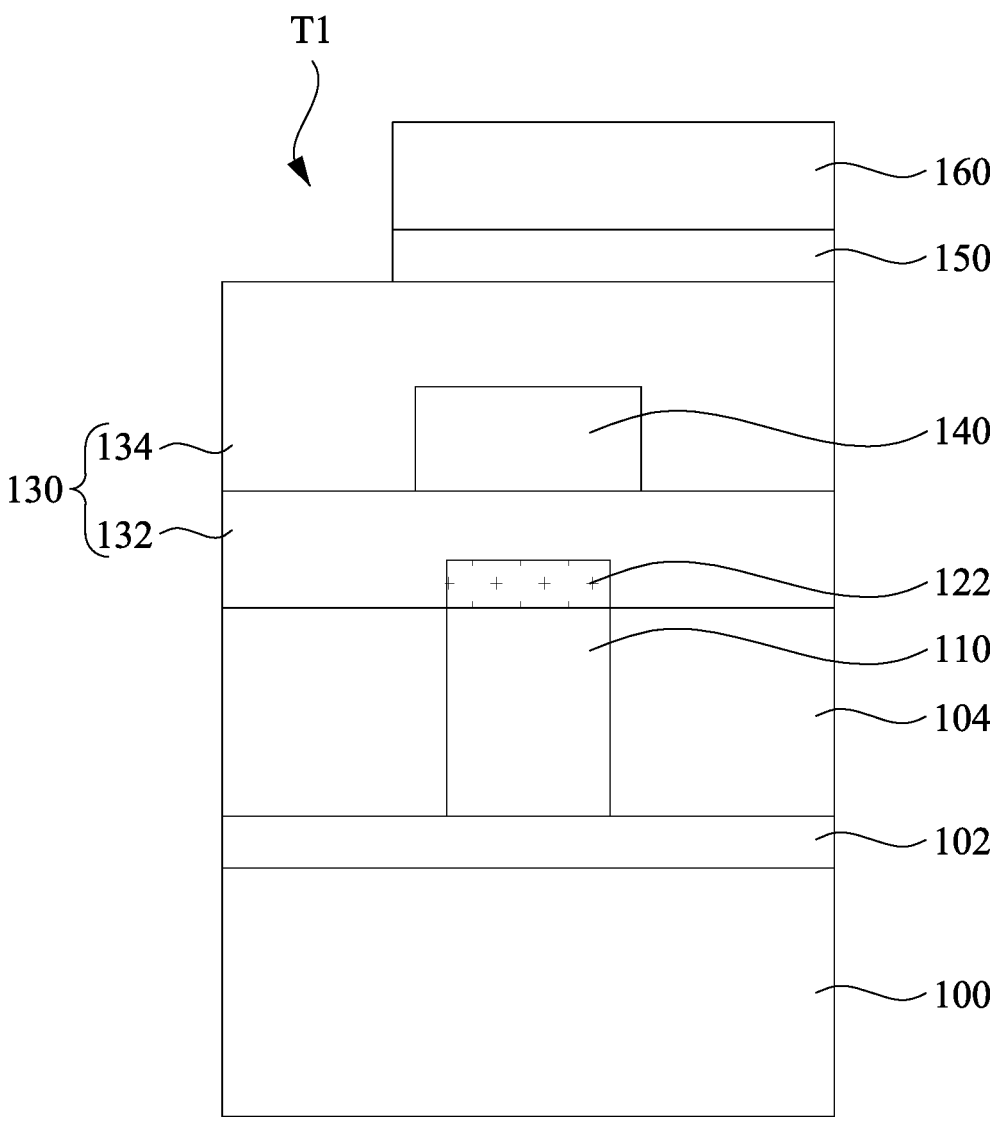

Referring to FIG. 12, a first trench T1 is formed to expose the dielectric layer 130 by patterning the dielectric layer 160 and the sacrificial layer 150. Specifically, a two-step etching process may be performed to form the first trench T1 through the dielectric layer 160 and the sacrificial layer 150 and exposing the dielectric layer 130. For example, the dielectric layer 160 may be firstly etched by using the photoresist layer PR1 (See FIG. 11) as a mask, and then the sacrificial layer 150 may be etched by using the etched dielectric layer 160 as a mask. Since the vertical projection of the opening O1 (See FIG. 11) of the photoresist layer PR1 on the dielectric layer 104 does not overlap the vertical projection of the bottom electrode 122 on the dielectric layer 104, a vertical projection of the first trench T1 on the dielectric layer 104 is spaced apart from the vertical projection of the bottom electrode 122 on the dielectric layer 104. Since the sacrificial layer 150 and the dielectric layer 130 are made of different materials, the dielectric layer 134 may act as an etch stop layer during etching the sacrificial layer 150. After the first trench T1 is formed, the photoresist layer PR1 may be removed.

Figure 13:
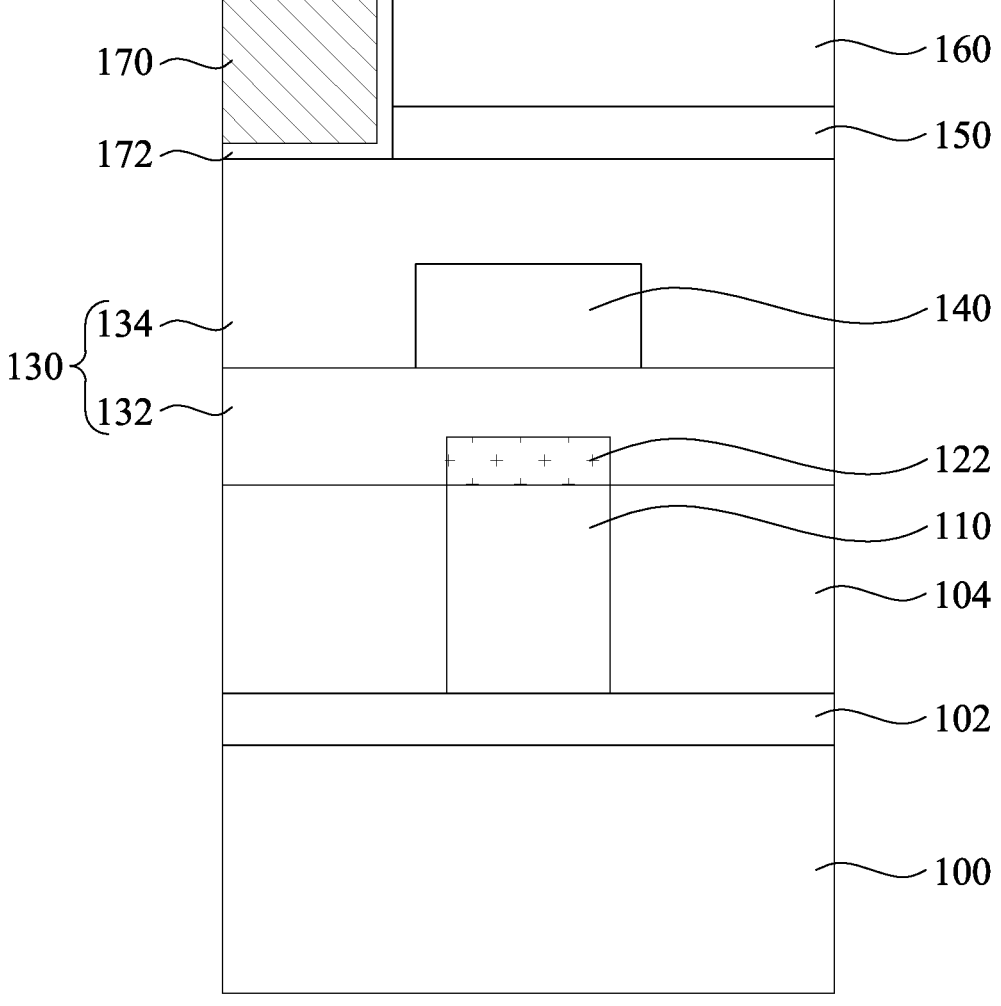

Referring to FIG. 13, a barrier material layer is formed in the first trench T1 (See FIG. 12), and then the bit line contact material is filled in the first trench T1 and covers the barrier material layer. After filling the bit line contact material, a planarization process is performed to remove excess portions of the barrier material layer and the bit line contact material, so a barrier layer 172 and the bit line contact 170 are formed in the first trench T1 and over the dielectric layer 130. The barrier layer 172 and the bit line contact 170 may inherit the profile of the first trench T1, and thus a vertical projection of the bit line contact 170 formed in the first trench T1 on the dielectric layer 104 is also spaced apart from a vertical projection of the bottom electrode 122 on the dielectric layer 104.

In some embodiments, the barrier layer 172 is made of conductive materials, such as metal nitrides, such as tantalum nitride or titanium nitride, but the disclosure is not limited thereto, and the bit line contact 170 is made of metal, such as tungsten (W), Titanium nitride (TiN), tantalum nitride (TaN), doped semiconductor material (e.g., p-doped or n-doped silicon), and/or other CMOS contact metals. In some embodiments, the thickness of the bit line contact 170 may be in a range of 10 nm to 300 nm.

During forming the barrier layer 172, which is made of metal nitrides, ammonia ($NH_3$) is used as a precursor to form the barrier layer 172, and thus the barrier layer 172 (or the barrier material layer) may contain hydrogen. During the formation of the bit line contact 170, hydrogen diffusion from the barrier material layer may occur due to the thermal effect of the deposition of the bit line contact 170. Therefore, in order to prevent hydrogen from affecting the subsequently formed channel made of oxide semiconductor, the bit line contact 170 is formed prior to the formation of the channel made of oxide semiconductor.

Figure 14:
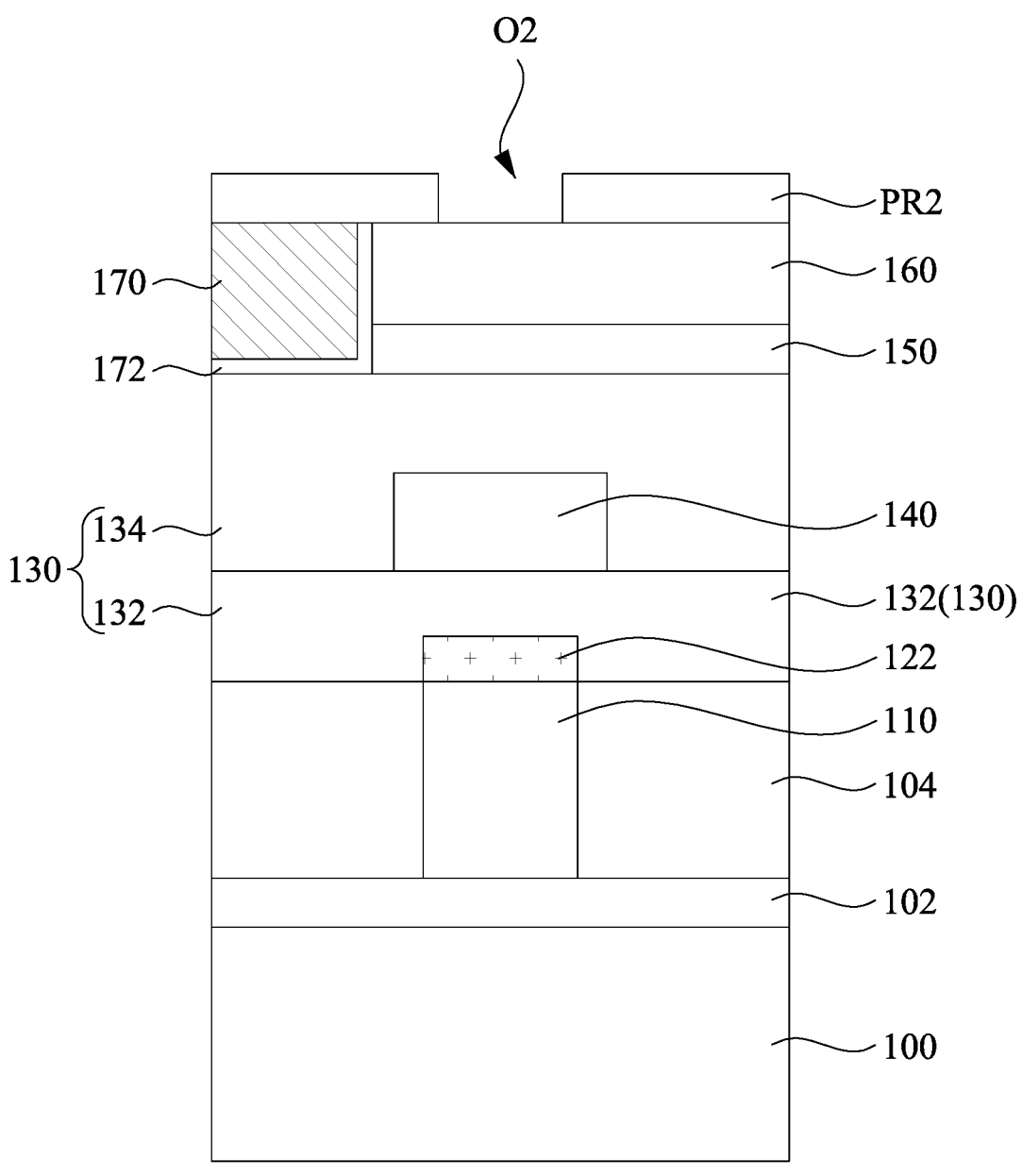

Referring to FIG. 14, a photoresist layer PR2 is formed over the bit line contact 170 and the dielectric layer 160. The photoresist layer PR2 includes an opening O2 exposing the dielectric layer 160 above the word line 140. The opening O2 may vertically overlap the dielectric layer 130 and the bottom electrode 122.

Figure 15:
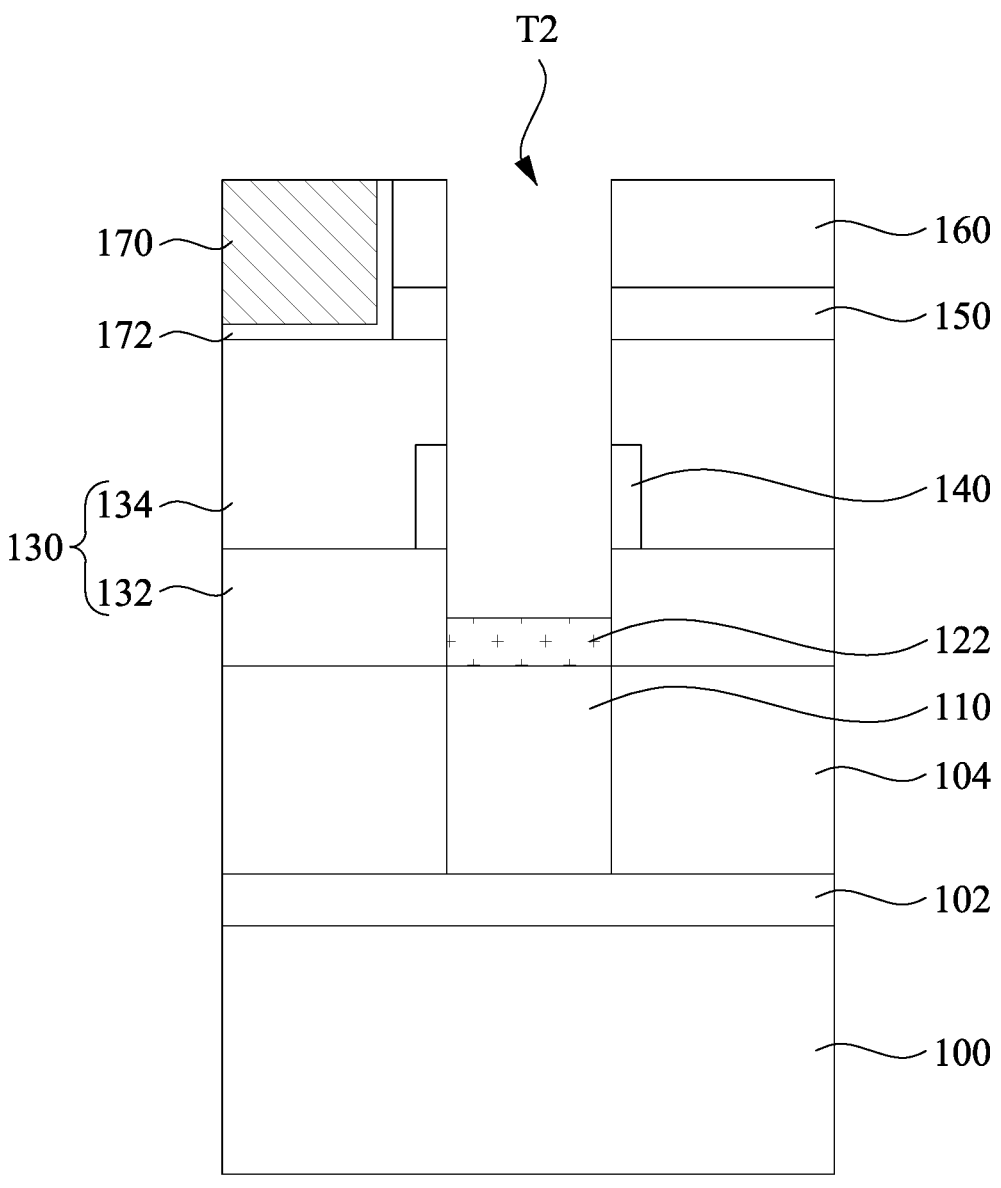

Subsequently, referring to FIG. 15, a second trench T2 penetrating through the dielectric layer 160, the sacrificial layer 150, the dielectric layer 130, the word line 140 is formed and exposes the bottom electrode 122. For example, the second trench T2 is formed by performing one or more etching processes through the opening O2 of the photoresist layer PR2, to remove portions of the dielectric layer 160, the sacrificial layer 150, the dielectric layer 130, the word line 140. Therefore, the word line 140 surrounds the second trench T2. The second trench T2 is spaced apart from the bit line contact 170. That is, the second trench T2 does not penetrate through the bit line contact 170.

Figure 16:
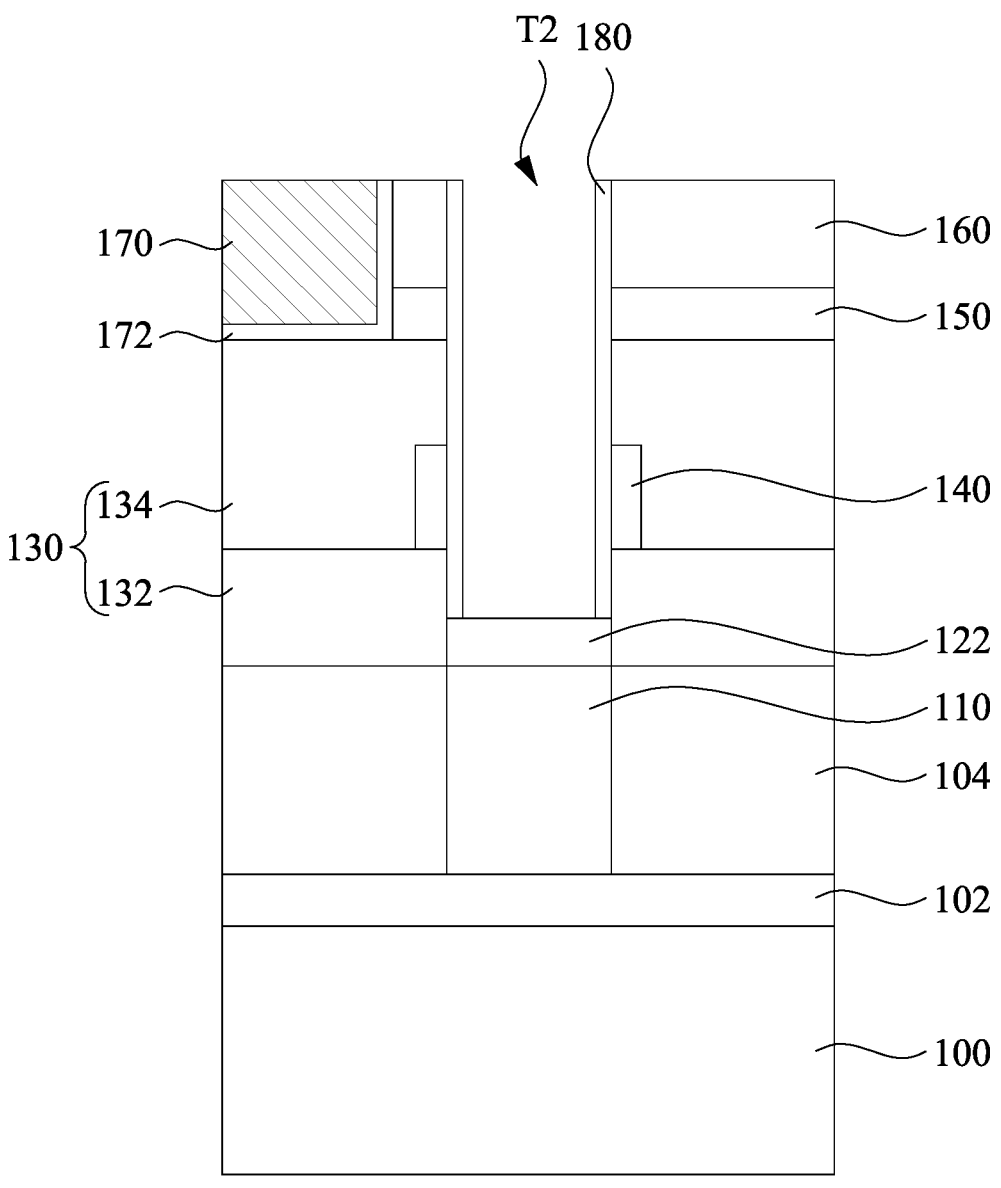

Referring to FIG. 16, a gate dielectric layer 180 lining a sidewall of the word line 140 is formed. Specifically, a gate dielectric material layer is firstly formed conformal to the sidewall and the bottom of the second trench T2 and the top surface of the bit line contact 170 and the dielectric layer 160. Subsequently, an anisotropic etching is performed to remove horizontal portion of the gate dielectric material layer, and the remaining portion of the gate dielectric material layer forms the gate dielectric layer 180.

Figure 17:
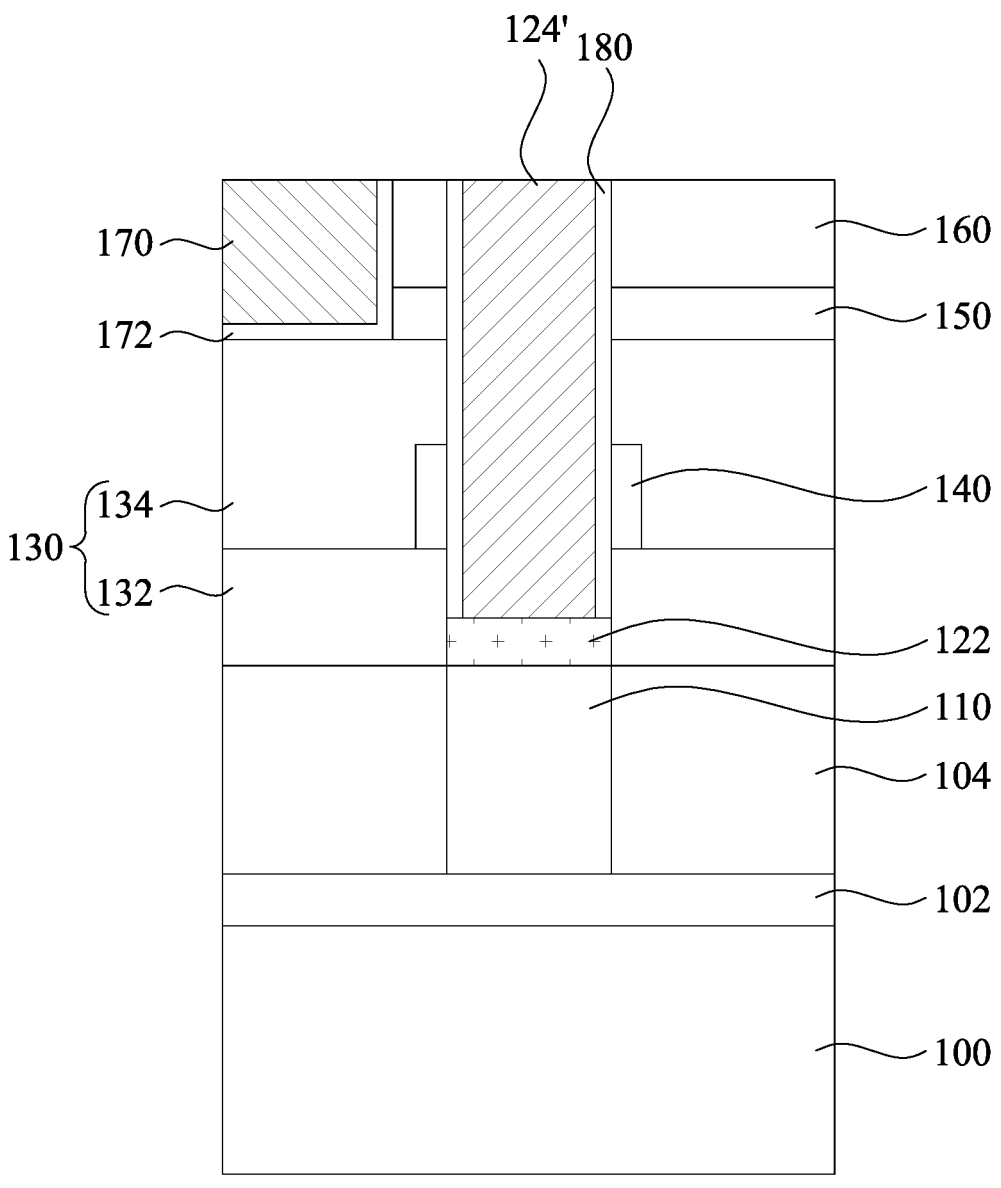
Figure 18:
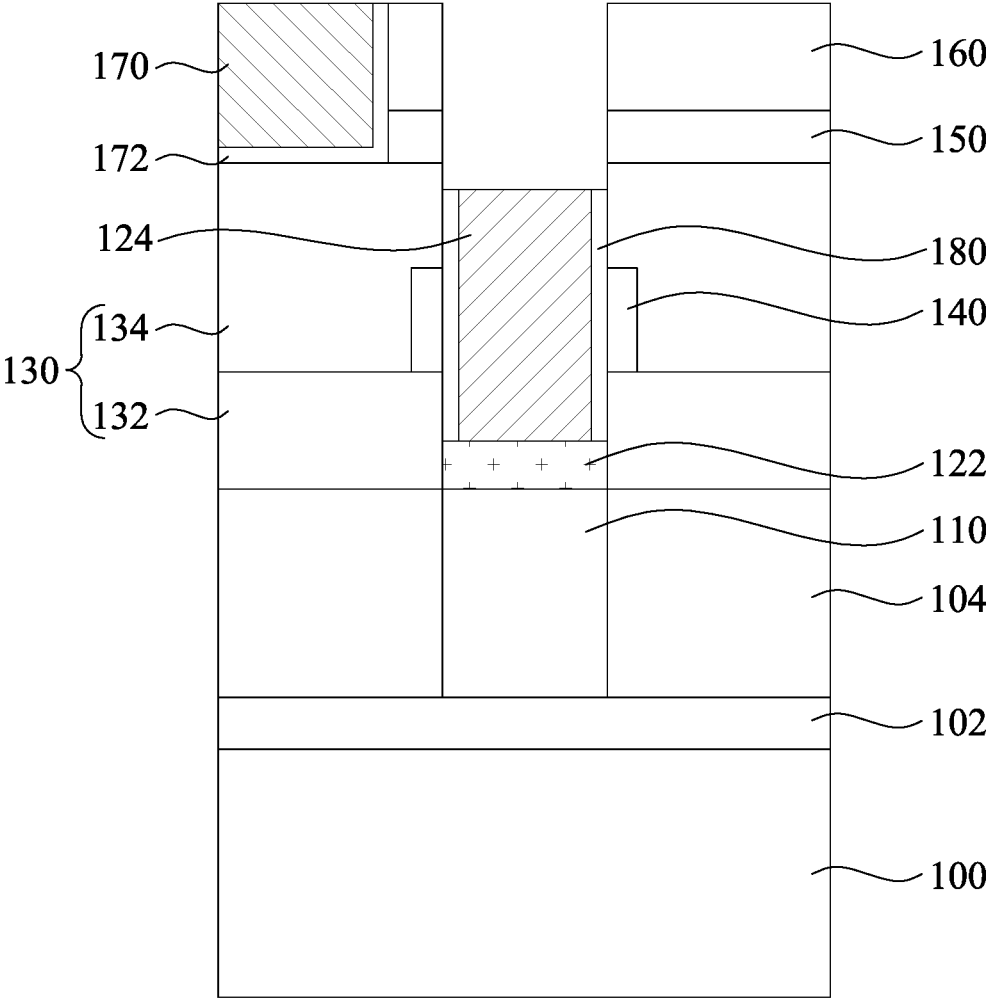

Referring to FIG. 17, a channel material 124' is filled in the second trench T2 (See FIG. 16). Subsequently, referring to FIG. 18, the channel material 124' and the gate dielectric layer 180 are etched back to lower top surfaces of the channel material 124' and the gate dielectric layer 180. In greater detail, the etching process may be stopped until top surfaces of the channel material 124' and the gate dielectric layer 180 are below the sacrificial layer 150, and the remaining portion of the channel material 124' forms the channel 124. That is, the channel 124 is formed after forming the bit line contact 170, and the vertical projection of the bit line contact 170 on the dielectric layer 104 is spaced apart from the vertical projection of the channel 124 on the dielectric layer 104. The channel 124 is made of oxide semiconductor, such as indium gallium zinc oxide (IGZO), indium zinc oxide (IZO), indium tin oxide (ITO), etc.

In some embodiments, the oxide semiconductor is sensitive to hydrogen. For example, hydrogen diffusion to the oxide semiconductor (e.g. channel 124) may induce unwanted threshold voltage shift to the oxide semiconductor device. As mentioned above, because the barrier layer 172 is formed under a hydrogen atmosphere, the present disclosure provides a method by forming the bit line contact 170 and the barrier layer 172 prior to forming the channel 124, and thus hydrogen diffusion would not affect the channel 124 formed in later step. As a result, the channel 124 is free of hydrogen, and the device performance may be improved.

Moreover, since the capacitor 110 is formed prior to the formation of the channel 124, the thermal effect during the manufacturing process of the capacitor 110 would not affect the formation of the channel 124.

Figure 19:
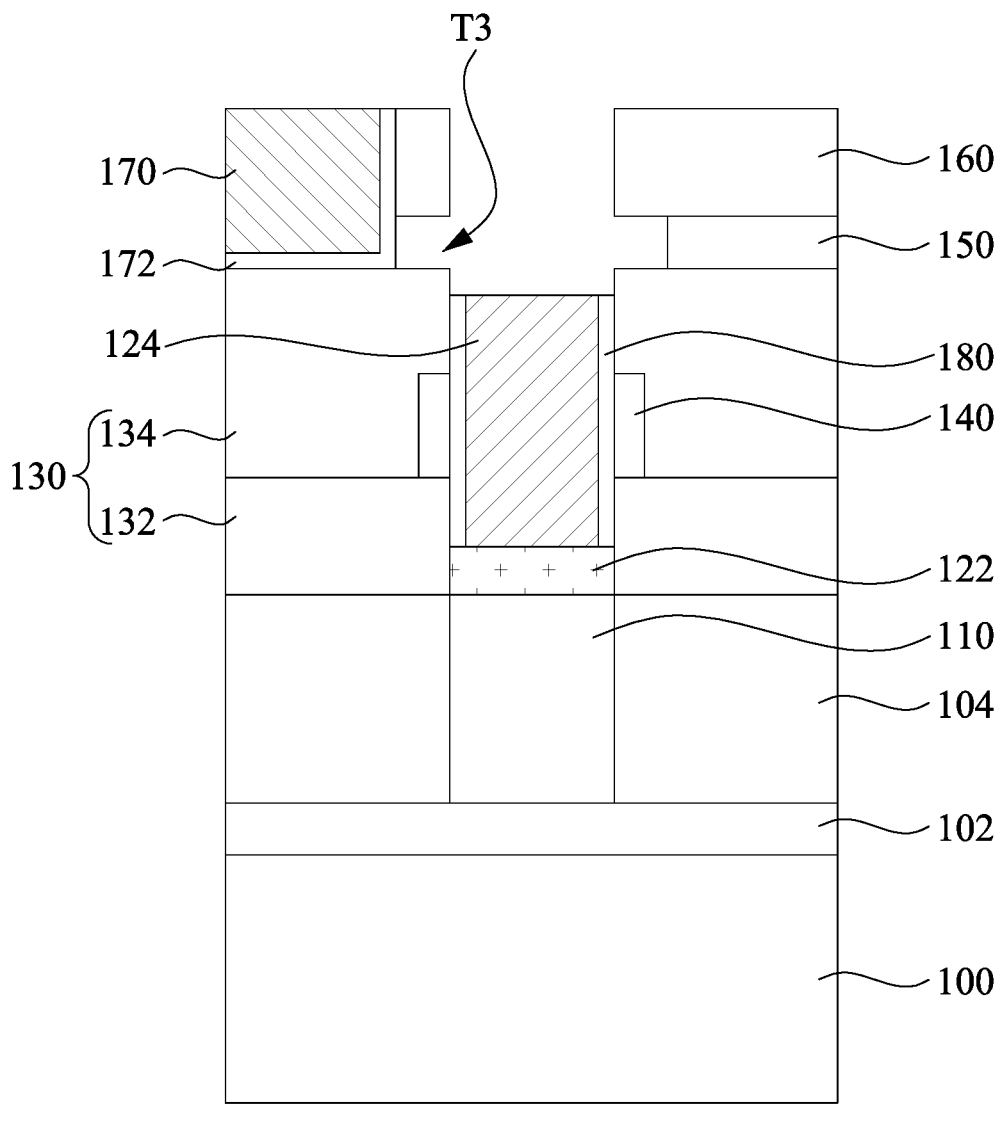

Referring to FIG. 19, a third trench T3 is formed by etching a portion of the sacrificial layer 150, such that the third trench T3 exposes a sidewall of the barrier layer 172. Specifically, a wet etching process is performed to laterally etch the portion of the sacrificial layer 150. Since the material of the sacrificial layer 150 is different from the materials of the dielectric layer 130 and the dielectric layer 160. The wet etching process only removes a portion of the sacrificial layer 150, and the dielectric layer 130 and dielectric layer 160 are kept substantially intact. In some embodiments, the wet etching process is performed until the third trench T3 exposes a sidewall of the barrier layer 172.

Figure 20:
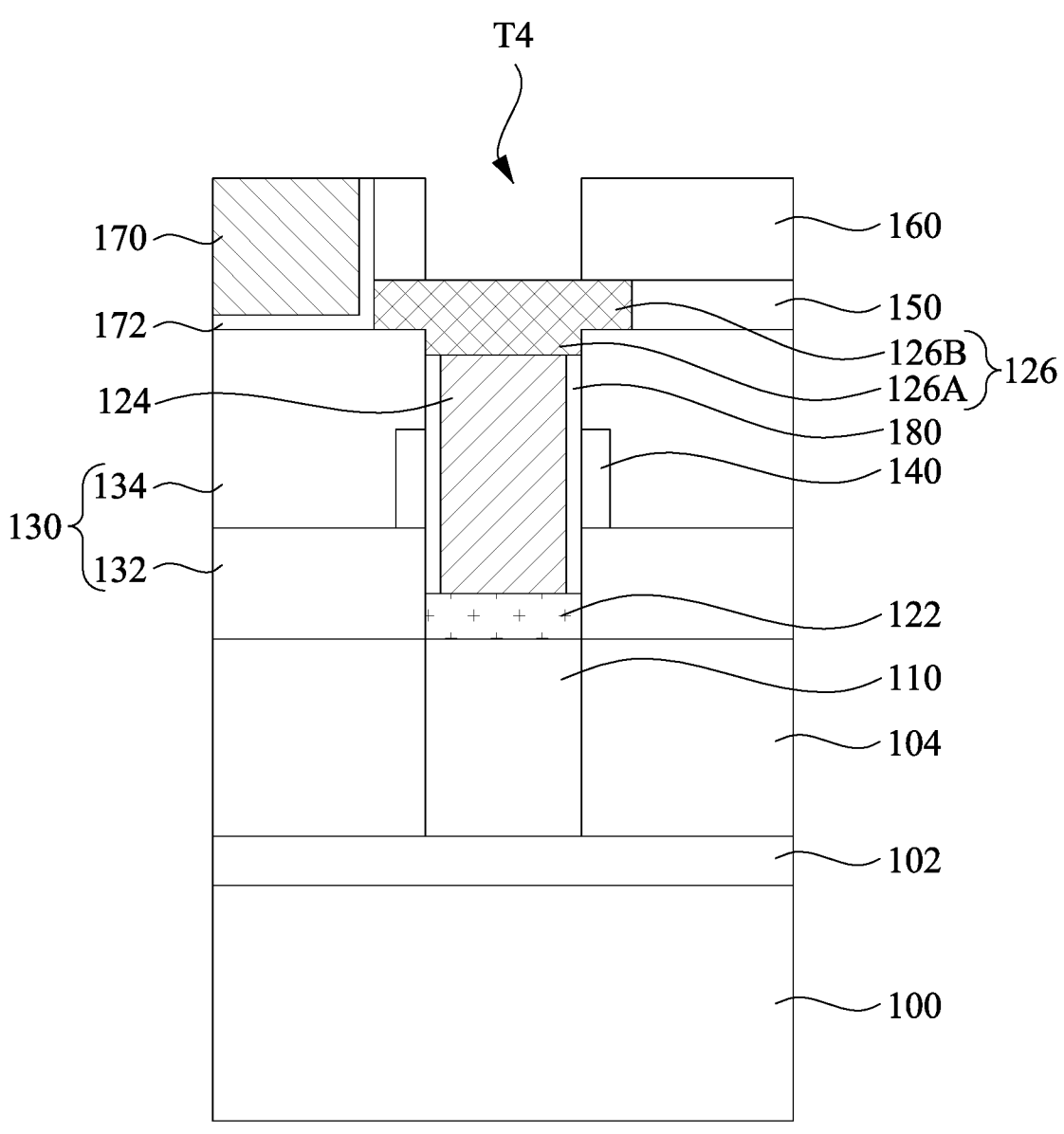

Referring to FIG. 20, a top electrode material is filled in the third trench T3, and a fourth trench T4 is formed by back-etching the top electrode material. The remaining portion of the top electrode material forms the top electrode 126. That is, the top electrode 126 is formed over the channel 124 and in contact with the barrier layer 172. A vertical projection of the top electrode 126 on the dielectric layer 104 completely covers the vertical projection of the channel 124 on the dielectric layer 104. More specifically, since the top electrode 126 is formed in third trench T3 protruding laterally from the sidewall of the gate dielectric layer 180, the top electrode 126 includes a first portion 126A and a second portion 126B over the first portion 126A. A sidewall of the second portion 126B of the top electrode 126 protrudes from a sidewall of the first portion 126A of the top electrode 126, and the sidewall of the second portion 126B of the top electrode 126 is in contact with the sidewall of the barrier layer 172. The bottom of the second portion 126B of the top electrode 126 is in contact with the dielectric layer 130. The sidewall of the first portion 126A of the top electrode 126 is vertically aligned with a sidewall of the gate dielectric layer 180. Moreover, since the dielectric layer 130 serves as the etch stop layer during forming the first trench T1 (FIG. 12) and the third trench T3 (FIG. 19), the bottom of the second portion 126B of the top electrode 126 is aligned with a bottom of the barrier layer 172 after forming the top electrode 126. In some embodiments, the top electrode 126 may be made of indium gallium zinc oxide (IGZO), indium zinc oxide (IZO), indium tin oxide (ITO). In some embodiments, the thickness of the top electrode 126 may be in a range of 10 nm to 50 nm.

After forming the top electrode 126, the dielectric layer 160 is in contact with a top surface of the top electrode 126 and a top surface of the sacrificial layer 150 (i.e. the dielectric layer 150 discussed in FIG. 1), and the sidewall of the barrier layer 172 is in contact with the dielectric layer 160 and the top electrode 126 at the same time.

Figure 21:
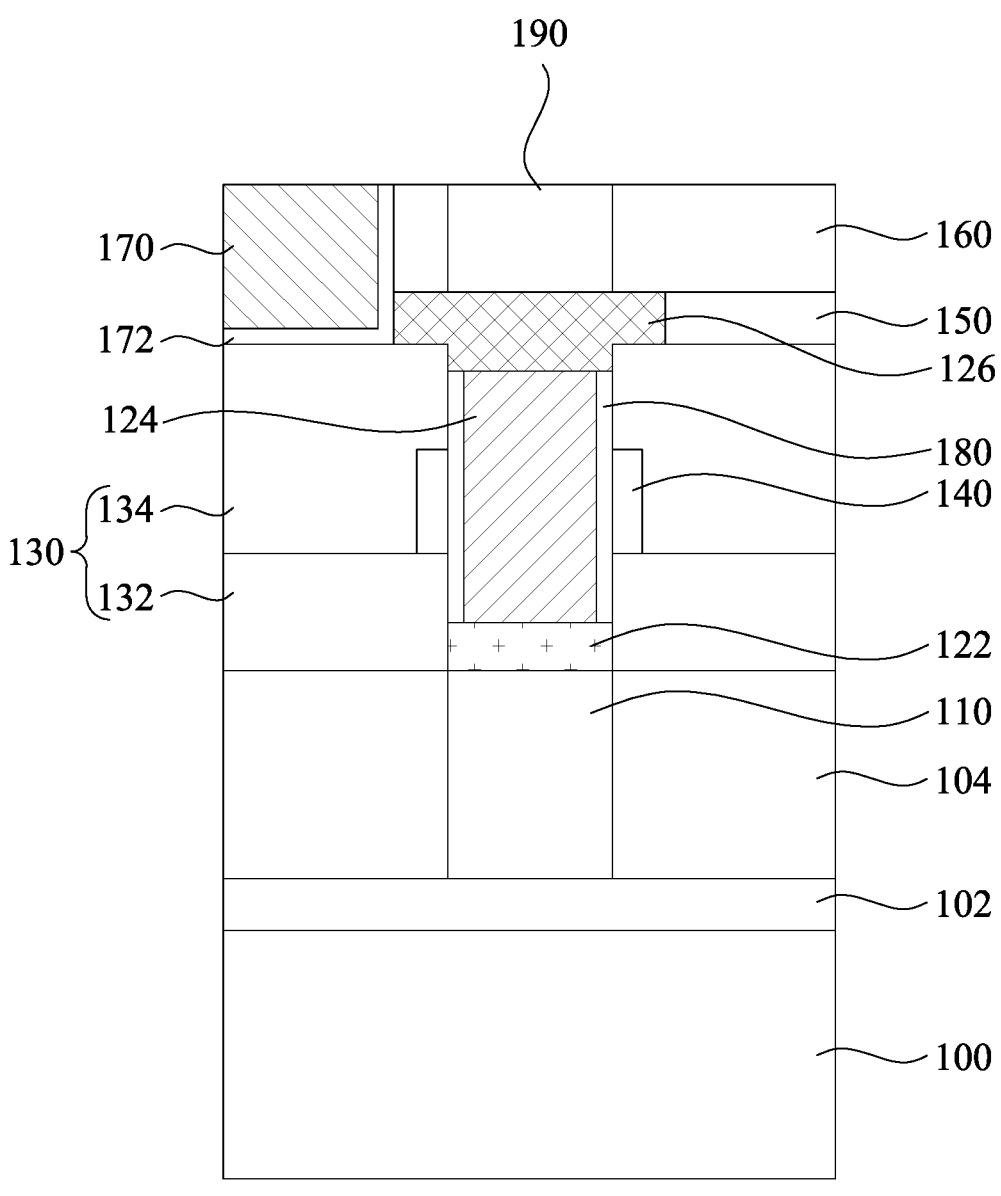

Referring to FIG. 21, a dielectric layer 190 is formed in the fourth trench T4 over the top electrode 126. Therefore, the dielectric layer 190 and the dielectric layer 160 cover the top surface of the top electrode 126, and the dielectric layer 190 is surrounded by the dielectric layer 160. In some embodiments, the dielectric layer 190 may be made of silicon oxide, silicon nitride, but the disclosure is not limited thereto.

Figure 22:
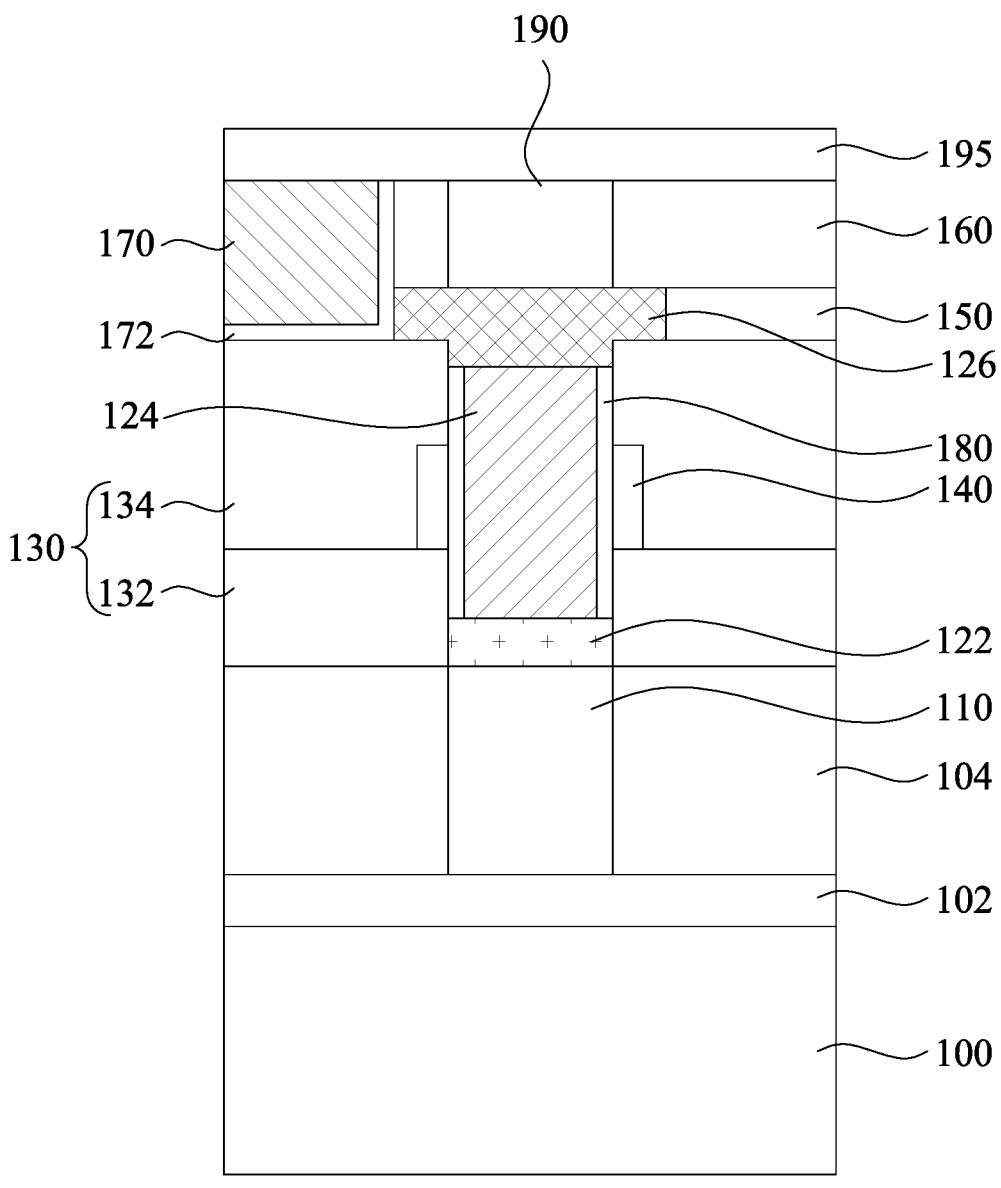

Subsequently, referring to FIG. 22, a bit line 195 is formed over the bit line contact 170, the dielectric layer 190 and the dielectric layer 160. In some embodiments, the bit line 195 may be made of tungsten (W), copper (Cu), or molybdenum (Mo), but the disclosure is not limited thereto. In some embodiments, the thickness of the bit line 195 may be in a range of 20 nm to 100 nm.

As mentioned above, the forming sequence and the location of the bit line contacts relative to the channel of the oxide semiconductor devices are adjusted to reduce the effect of the hydrogen diffusion to the oxide semiconductor devices. More specifically, since the bit line contact and the barrier layer are formed before forming the channel, hydrogen in the barrier layer wrapping the bit line contact diffuses into the dielectric layer but does not diffuse to the channel. Therefore, hydrogen will not affect the characteristic of the channel. For example, threshold voltage shift caused by hydrogen diffusion may be avoided.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising:
   a first dielectric layer;
   a capacitor in the first dielectric layer;
   a bottom electrode over the capacitor;
   a channel over the bottom electrode;
   a top electrode over the channel;
   a gate dielectric layer surrounding the channel;
   a word line surrounding the gate dielectric layer;
   a second dielectric layer surrounding the word line, the gate dielectric layer and the channel;
   a bit line contact over the second dielectric layer, wherein a vertical projection of the bit line contact on the first dielectric layer is spaced apart a vertical projection of the channel on the first dielectric layer; and
   a barrier layer between the bit line contact and the top electrode.

2. The memory device of claim 1, wherein a vertical projection of the top electrode on the first dielectric layer completely covers the vertical projection of the channel on the first dielectric layer.

3. The memory device of claim 1, wherein the top electrode comprises a first portion and a second portion over the first portion, a sidewall of the second portion of the top electrode protrudes from a sidewall of the first portion of the top electrode, and the sidewall of the second portion of the top electrode is in contact with the sidewall of the barrier layer.

4. The memory device of claim 3, wherein the sidewall of the first portion of the top electrode is aligned with a sidewall of the gate dielectric layer.

5. The memory device of claim 3, wherein a bottom of the second portion of the top electrode is aligned with a bottom of the barrier layer.

6. The memory device of claim 3, wherein a bottom of the second portion of the top electrode is in contact with the second dielectric layer.

7. The memory device of claim 1, further comprising:

a third dielectric layer over the top electrode; and a fourth dielectric layer in contact with a sidewall of the top electrode, wherein the third dielectric layer is in contact with a top surface of the top electrode and a top surface of the fourth dielectric layer, and the fourth dielectric layer is made of different material from the third dielectric layer.

8. The memory device of claim 7, wherein the third dielectric layer over the top electrode is further in contact with a sidewall of the barrier layer.

9. The memory device of claim 1, wherein the channel is made of oxide semiconductor material.

10. The memory device of claim 1, further comprising a bit line in contact with the bit line contact.

* * * * *